United States Patent [19]
Jorgensen

[11] Patent Number: 5,920,556
[45] Date of Patent: Jul. 6, 1999

[54] FREQUENCY MODULATION USING A PHASE-LOCKED LOOP

[75] Inventor: Klaus Jorgensen, Lyngby, Denmark

[73] Assignee: Nokia Mobile Phones Limited, Espoo, Finland

[21] Appl. No.: 08/846,543

[22] Filed: Apr. 30, 1997

[30] Foreign Application Priority Data

May 7, 1996 [GB] United Kingdom .................. 9609466

[51] Int. Cl.⁶ ..................................................... H04J 3/06
[52] U.S. Cl. .......................... 370/350; 375/354; 375/373; 375/376
[58] Field of Search .................................... 370/320, 337, 370/347, 350, 442, 336, 341, 345, 480, 478; 375/215, 221, 226, 294, 327, 343, 373, 375, 376, 344, 308, 306, 307, 354, 355, 356, 359, 360

[56] References Cited

U.S. PATENT DOCUMENTS

| | | | |
|---|---|---|---|
| 3,810,046 | 5/1974 | Lance | 332/19 |
| 4,052,672 | 10/1977 | Enderby et al. | 325/147 |
| 4,743,867 | 5/1988 | Smith | 455/26 |
| 4,937,537 | 6/1990 | Nyqvist | 331/17 |
| 5,111,162 | 5/1992 | Hietala et al. | 375/344 |
| 5,153,468 | 10/1992 | Jokinen et al. | 307/520 |
| 5,175,510 | 12/1992 | Satomaki | 331/17 |
| 5,200,977 | 4/1993 | Ohnishi et al. | 375/344 |
| 5,315,183 | 5/1994 | Ruotsalainen | 307/511 |
| 5,317,283 | 5/1994 | Korhonen | 331/1 A |
| 5,319,798 | 6/1994 | Watanabe | 370/344 |
| 5,325,075 | 6/1994 | Rapeli | 332/103 |
| 5,424,688 | 6/1995 | Phillips | 375/308 |
| 5,430,416 | 7/1995 | Black et al. | 455/126 |
| 5,519,887 | 5/1996 | Lieu | 455/266 |
| 5,521,947 | 5/1996 | Madsen | 375/375 |
| 5,584,062 | 12/1996 | Meador et al. | 455/260 |
| 5,703,539 | 12/1997 | Gillig et al. | 331/16 |

FOREIGN PATENT DOCUMENTS 2233844  1/1991  United Kingdom .

*Primary Examiner*—Dang Ton
*Assistant Examiner*—Phirin Sam
*Attorney, Agent, or Firm*—Perman & Green, LLP

[57] ABSTRACT

A transmitter transmitting signal bursts to a TDMA communication system, and comprising a frequency synthesizing circuit having an input on which a bit flow is received, and an output on which a data-modulated output signal is supplied, a controller controlling the transmission of the transmitter and a stable clock signal generator supplying a stable clock signal. The frequency synthesizing circuit includes a phase-locked loop (PLL) comprising a voltage controlled oscillator (VCO) and a phase detecting unit. The voltage controlled oscillator (VCO) generates an output signal whose frequency is controlled by a control signal, said output signal being modulated in response to the data bit flow received on the input. The phase detecting unit compares the output signal supplied by the voltage controlled oscillator with the stable clock signal supplied by the stable clock signal generator and supplies an error signal in response thereto. A compensating circuit which receives a measure of the bit flow received, compensates the error signal for contributions originating from the bit flow received, and supplies the compensated error signal as a control signal to the voltage controlled oscillator (VCO). The transmitter furthermore includes swithing means controlled by said controller for resetting said error signal before the transmision of a burst.

14 Claims, 2 Drawing Sheets

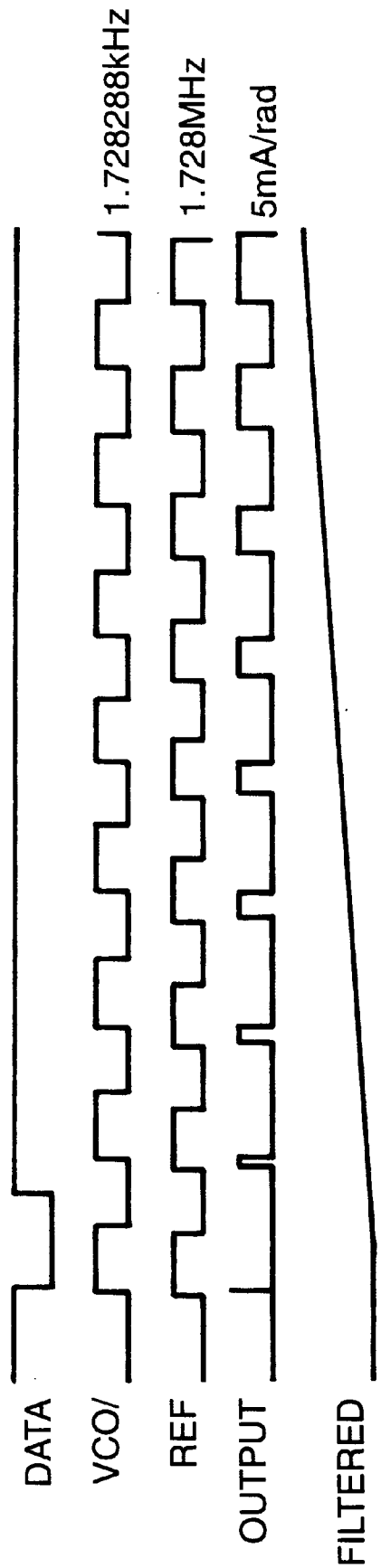

FREQUENCY MODULATION USING A PHASE-LOCKED LOOP

BACKGROUND TO THE INVENTION

The invention concerns a method of frequency synthesis in a transmitter transmitting signal bursts to a TDMA communication system, said frequency synthesis is based on a phase-locked loop, wherein a data-modulated output signal is generated by a voltage controlled oscillator in the phase-locked loop in response to a modulating bit flow received on an input of the oscillator. Finally, the invention concerns a frequency synthesizing circuit as well as a radio telephone having such a circuit.

When data modulating the VCO in a PLL are constant (zeros or ones) for an period or possess a preponderance of either zeros or ones, the output frequency of the VCO differs from the nominal centre frequency in this, period owing to the modulation with data. The PLL therefore reacts by trying to bring the frequency back to the nominal centre frequency. This is a problem in particular in connection with the telephone which is associated with digital cordless systems in which the VCO is modulated directly with data.

To obtain rapid locking, the loop must have a high loop bandwidth (about 20 kHz), while a low loop bandwidth (about 2 kHz) is required to prevent the modulation frequency from affecting the PLL. If the modulation in a data packet does not vary or possess a preponderance of either zeros or ones, the modulation frequency will be within the loop bandwidth.

Some therefore work with a concept wherein the loop is closed when searching on a frequency, and is opened during modulation with data. This has several drawbacks, one of which being that the capacitors of the loop are discharged, resulting in frequency drift. Finally, the transmitter power is increased, resulting in battery voltage drop and change in load. This is unfortunate, as the VCO is extremely sensitive to variations in the battery voltage and to changes in the load. The transmitter leaks output power to the VCO, which results in frequency jumps because of the open loop. When the loop is opened, modulation occurs because of mechanical vibrations, and VCO phase noise is not reduced within the loop bandwidth. While, with a view to the long uniform bit trains, it appears to be expedient to open the loop, this involves a number of considerable problems.

SUMMARY OF THE INVENTION

The invention provides a method whereby the carrier frequency of the zmodulated output signal is kept stable during data bursts for a TDMA communication system, even in case of long sequences in the data bit flow where data possess a preponderance of either zeros or ones.

This is achieved by the method of the invention by monitoring of the transmission of the transmitter, generating an error signal which depends on the phase difference between the output signal of the voltage controlled oscillator and a stable clock signal and which is supplied as a control signal to the voltage controlled oscillator (VCO), compensating the generated error signal for contributions originating from the bit flow received and resetting said error signal before starting the transmission of a burst.

If data modulating the VCO are substantially constant (zeros or ones) for a period, the output frequency of the VCO differs from the nominal centre frequency during this period because of the frequency modulation, and after some time (determined by the filters of the loop) the phase detector begins to compensate for this frequency shift. Generation of the compensating signal, which compensates the error signal for the error introduced by the data signal, which does not vary for a period, ensures that the PLL does not react to frequency shifts which are caused by the modulating data.

When the received bit flow is integrated in time and a compensating current is generated in response to the integrated bit flow, the effect of the bit flow on the VCO may be estimated, making it possible to deduct a contribution corresponding to this effect from the error signal. It is hereby ensured that the PLL will not try to compensate for the error which the PLL would otherwise observe by comparing with the reference signal.

The compensation itself may advantageously take place by running a compensating current from the phase detecting unit output of the PLL in response to the integrated bit flow.

The transmitter according the invention for transmitting signal bursts to a TDMA communication system, comprises a frequency synthesizing circuit having an input on which a bit flow is received, and an output on which a data-modulated output signal is supplied, a controller controlling tie transmission of the transmitter and a stable clock signal generator supplying a stable clock signal. The frequency synthesizing circuit has a phase-locked loop (PLL) comprising a voltage controlled oscillator (VCO) and a phase detecting unit. The voltage controlled oscillator (VCO) generates an output signal whose frequency is controlled by a control signal, said output signal being modulated in response to the data bit flow received on the input. The phase detecting unit compares the output signal supplied by the voltage controlled oscillator with the stable clock signal supplied by the stable clock signal generator and supplies an error signal in response thereto. A compensating circuit receives a measure of the bit flow received, and compensates the error signal for contributions originating from the bit flow received, and supplies the compensated error signal as a control signal to the voltage controlled oscillator (VCO). Switching means controlled by said controller resets the error signal before the transmision of a burst. The bandwidth of the loop can hereby ensure a rapid transient, while compensating, in the loop, for long, non-varying bit flows during the burst.

In the preferred embodiment, the compensating circuit comprises an integrator to integrate the received bit flow in time to a voltage signal, and a voltage-to-current converter which, in response to the voltage signal from the integrator, generates a current signal which is combined with the error signal of the phase detecting unit to generate the compensated error signal. The compensated error signal is produced in that the phase detecting unit output is connected to earth via a power generator which is controlled by the output voltage of the integrator. The switching means is provided in parallel with the integrator.

Finally, the invention concerns a radio telephone for use in e.g. a digital cordless system, such as DECT, or another system where long-cycle non-varying bit trains may occur, and comprising a frequency synthesizing circuit as described.

BRIEF DESCRIPTION OF THE DRAWINGS

The invention will be explained more fully below in connection with a preferred embodiment and with reference to the drawing, in which FIG. 1 schematically shows a preferred embodiment of a frequency synthesizing circuit of the invention;

FIG. 3 shows the signal course of some of the signals which are essential to the understanding of the invention.

DETAILED DESCRIPTION OF THE INVENTION

The invention will be explained below in connection with a DECT telephone system, which is a Digital, European Cordless Telephone system based on digital transmission of data in time slots. The data transmission takes place in DECT at a nominal centre frequency of the order of 1900 MHz. The frequency fluctuation about the centre frequency is of the order of +/−238 kHz depending on modulation data. However, the invention may be applied in other connections where the centre frequency of a modulated data signal appears to drift, but where the drift is caused by the nature of the data.

Figure 1:
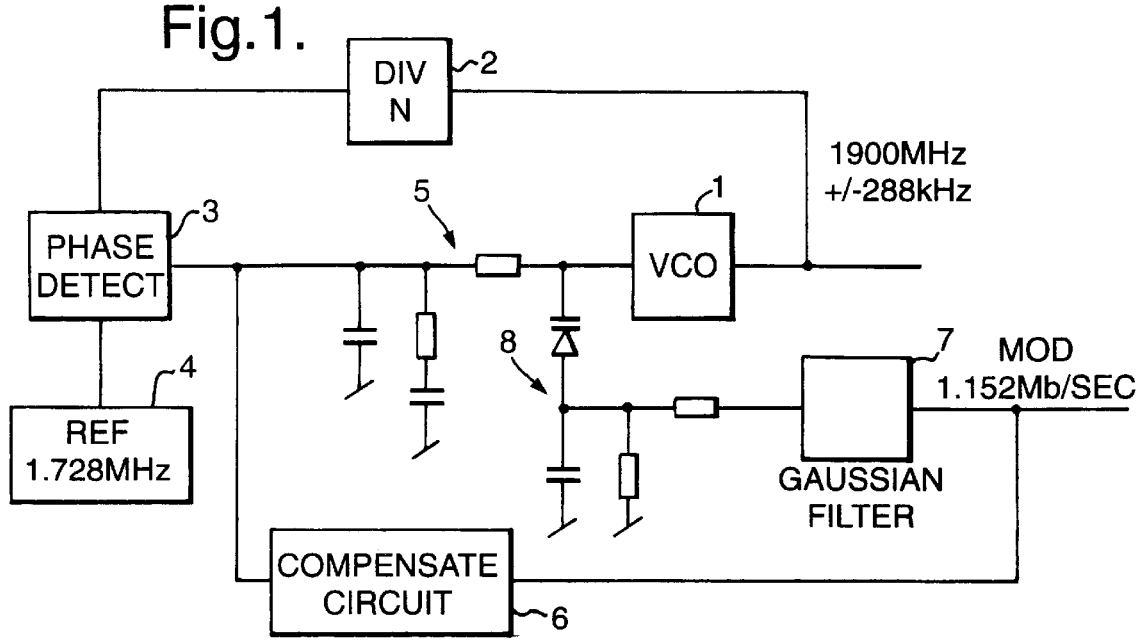

FIG. 1 shows a preferred embodiment of a frequency synthesizing circuit of the invention, and it will be seen that the circuit comprises a phase-locked loop (PLL) having a voltage controlled oscillator 1 which supplies a modulated signal at 1900 MHz with a frequency fluctuation of +/−288 kHz. As will be known to a person skilled in the art, this signal is supplied to an output amplifier (PA stage), which applies the amplified signal via a switch to the antenna of the telephone. These parts of the telephone are not necessary to the understanding of the invention and are therefore not shown, as they are presumed to be known to a person skilled in the art.

Part of the output signal from the VCO is passed via the phase-locked loop to a frequency divider 2 which divides the frequency of the modulated signal from the VCO by a factor N, which is 1088–1099 in the present case, depending on the channel on which the radio telephone transmits. The divided signal is passed in the phase-locked loop from the frequency divider 2 to a phase detector 3, where it is compared with a stable pulse clock signal from a pulse generator 4, which supplies a signal of stable frequency. The pulse generator 4 may be a crystal oscillator supplying a pulse signal having the frequency 1.728 MHz, but in connection with DECT telephones a crystal oscillator supplying a frequency of 10.368 MHz is usually included, said 1.728 MHz being obtained by dividing the frequency from this oscillator by a factor 6. The phase detector 3 compares the reference signal with the frequency-divided, data-modulated signal and supplies an error signal in response to this comparison.

The data signal modulating the VCO is shown at the top in FIG. 3. The second level shows the signal which has been passed to one input of the phase detector via the phase-locked loop, while the third level shows the reference signal which is passed to the other input of the phase detector. The output signal from the phase detector 3 is shown as OUTPUT, and it will be seen that an error pulse is created in the OUTPUT signal at an increasing flank of a pulse in the reference signal, and that this pulse continues until an increasing flank is observed in the frequency-divided data signal. In the case shown, the error signal OUTPUT assumes a value corresponding to 5 mA/rad. The output signal from the phase detector 3 is low-pass filtered by a low-pass filter 5 (loop filter), and in the absence of compensation with a compensating signal, the error signal at the bottom of FIG. 3 will be obtained. This error signal, when compensated as stated in the present specification, will follow the horizontal broken line, and it is passed to the VCO 1 on the modulation input, thereby compensating for drift in the VCO frequency with respect to the reference signal.

Data (1.152 Mbit/s), with which the VCO is modulated, are passed first to a Gaussian filter 7 and then via an attenuator 8 to the modulation input on the VCO 1. Before the Gaussian filter 7, the data signal is branched, and part of this is passed to a compensating circuit 6, where it is integrated in time and a compensating signal is generated to compensate the error signal from the phase detector 3 for contributions originating from the received data bit flow, before the error signal is supplied as a control signal to the voltage controlled oscillator 1.

Figure 2:
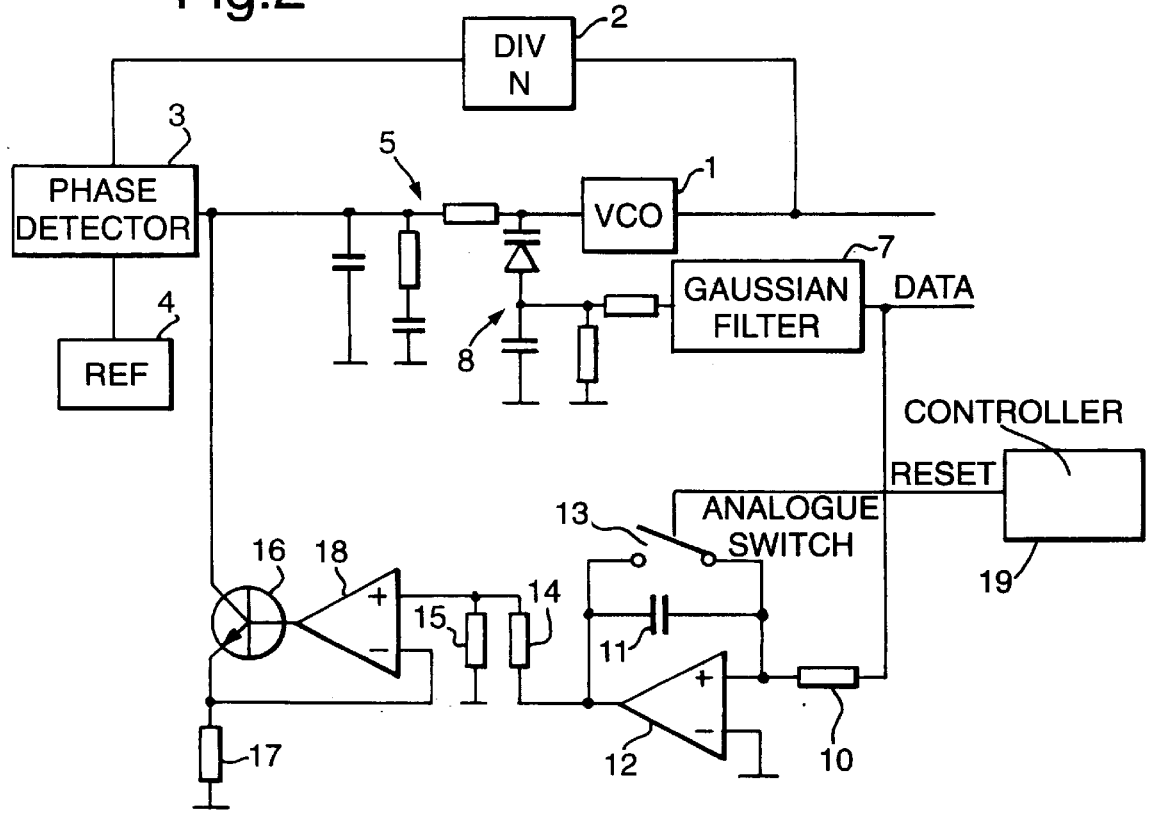
FIG. 2 shows a compensating circuit used in connection with a frequency synthesizing circuit of the invention.

The compensating circuit 6 will be explained more fully below, with reference to FIG. 2. The compensating circuit 6 comprises an integrator and a power generator in the preferred embodiment of the invention.

The integrator receives the data signal on the input and is based on a capacitor 11, a resistor 10, and an operation amplifier 12. The operation amplifier 12 builds up a voltage across the capacitor 11, and this voltage represents the integrated signal, the integration time being controlled by adapting the capacitor 11 to the resistor 10. The integration time is adapted so as to correspond to the sensitivity of the phase detector 3. Provided in parallel with the integrator is an analog switch 13 which discharges the capacitor 11 before start. This discharge is controlled by a reset signal from the a controller 19 monitoring the network activities of the phone. The resetting takes place while the phase-locked loop searches a frequency—prior to locking.

The power generator receives the signal integrated by the integrator on the input and is based on three resistors 14, 15 and 17, an operation amplifier 18, and an NPN transistor 16. The operation amplifier 18 amplifies the integrated data signal, which is then used as a control signal for the transistor 16 and is therefore supplied to its base. With its emitter collector path, the transistor 16 creates a current path between the phase detector output and earth via the resistor 17. The current in this current path is used for compensating for the apparent error which occurs on the output of the VCO 1, but which is caused by data. This apparent error is also found on the phase detector output, but by deducting a current whose size is controlled precisely by the data responsible for the introduced, apparent error, the invention ensures that the PLL does not compensate for the effect of the data bit flow on the output signal from the VCO.

It may be said that data in extreme, but frequently occurring, cases create a correct output signal from the VCO, but which appears to have drifted and thus be wrong. However, the error occurs only when the phase detector compares the VCO signal with a reference signal and tries to correct the VCO signal by shifting the frequency toward the reference signal frequency According to the invention, the error signal from the phase detector output is modulated by a signal which corresponds to the effect of the data signal on the VCO signal, thereby compensating for the effect of the data signal on the error signal.

What is claimed is:

1. A method of frequency synthesis in a transmitter transmitting signal bursts to a TDMA communication system, wherein said transmitter has a data-modulated output signal that is generated by a voltage controlled oscillator (VCO) in a phase-locked loop (PLL) with a predetermined fixed bandwidth, in response to a modulating bit flow received on an input of the oscillator, said method comprising the steps of:

monitoring the transmission of the transmitter;

generating an error signal which depends on the phase difference between the output signal of the voltage controlled oscillator and a stable clock signal and which is supplied as a control signal to the voltage controlled oscillator (VCO);

generating a current signal which depends on the bit flow received;

combining the error signal and the current signal in order to generate a compensated error signal;

providing said compensated error signal as a control signal to the voltage controlled oscillator (VCO); and resetting said error signal before starting the transmission of a burst.

2. A method according to claim 1, wherein a compensating contribution is generated on the basis of the bit flow by integrating the received bit flow in time, and a compensating current is generated in response to the integrated bit flow.

3. A method according to claim 1, wherein a phase detecting unit determines the error signal, and wherein a compensating current is drawn from the phase detecting unit output toward earth in response to the integrated bit flow.

4. A transmitter for transmitting signal bursts to a TDMA communication system, and comprising:

a frequency synthesizing circuit having an input on which a bit flow is received, and an output on which a data-modulated output signal is supplied;

a controller controlling the transmission of the transmitter;

a stable clock signal generator supplying a stable clock signal;

said frequency synthesizing circuit having a phase-locked loop (PLL) with a predetermined fixed bandwidth and comprising a voltage controlled oscillator (VCO) and a phase detecting unit;

said voltage controlled oscillator (VCO) generating an output signal with a frequency controlled by a control signal, said output signal being modulated in response to the data bit flow received on the input;

said phase detecting unit comparing the output signal supplied by the voltage controlled oscillator with the stable clock signal supplied by the stable clock signal generator and supplying an error signal in response thereto;

a compensating circuit which receives a measure of the bit flow received, said compensating circuit comprising:

means for generating a current signal which depends on the bit flow received; and means for combining the error signal supplied by the phase detecting unit and the current signal in order to generate a compensated error signal and for supplying the compensated error signal as the control signal to the voltage controlled oscillator (VCO); and switching means controlled by said controller for resetting said error signal before the transmission of a burst.

5. A transmitter according to claim 4, wherein the compensating circuit comprises an integrator to integrate the received bit flow in time to a voltage signal, and a voltage-to-current converter which converts the voltage signal from the integrator to a current signal which depends on the bit flow received, and wherein the current generated by the voltage-to-current converter is combined with the error signal supplied by the phase detecting unit to generate the compensated error signal.

6. A transmitter according to claim 5, wherein the voltage-to-current converter comprises a transistor connecting the phase detecting unit output to earth, and wherein the size of the current running from the phase detecting unit output to earth is controlled by the voltage signal from the integrator to the control electrode of the transistor.

7. A transmitter according to claim 6, wherein the voltage-to-current converter additionally comprises an operation amplifier with one input terminal connected to the output of the integrator and to earth via resistor.

8. A transmitter according to claim 4, wherein the data-modulated output signal supplied by the voltage controlled oscillator (VCO) has a frequency of about 1900 MHz with a frequency fluctuation of +/−288 kHz, and wherein the output signal is returned to the phase detecting unit via a frequency divider in the phase-locked loop (PLL).

9. A radio telephone including a transmitter for transmitting signal bursts to a TDMA communication system, said transmitter comprising:

a controller for controlling the transmission of the transmitter;

a stable clock signal generator for supplying a stable clock signal;

a frequency synthesizing circuit having an input on which a data bit flow is received and an output on which a data-modulated output signal is supplied, said frequency synthesizing circuit having a phase-locked loop (PLL) with a predetermined fixed bandwidth and comprising:

a voltage controlled oscillator (VCO) for generating an output signal with a frequency controlled by a control signal, said output signal being modulated in response to the data bit flow received on the input; and a phase detecting unit for comparing the output signal supplied by the voltage controlled oscillator with the stable clock signal supplied by the stable clock signal generator and supplying an error signal in response thereto;

a compensating circuit for receiving a measure of the bit flow received and comprising:

means for generating a current signal which depends on the bit flow received; and means for combining the error signal supplied by the phase detecting unit and the current signal and generating and supplying a compensated error signal as the control signal to the voltage controlled oscillator (VCO); and switching means controlled by said controller for resetting said error signal before the transmission of a burst.

10. A radio telephone according to claim 9 wherein said transmitter comprises means for communicating in a DECT communication system.

11. A radio telephone according to claim 9, wherein the compensating circuit comprises an integrator for integrating the received bit flow in time to a voltage signal, and a voltage-to-current converter for converting the voltage signal from the integrator to a current signal which depends on the bit flow received, and and further comprising means for combining the current generated by the voltage-to-current converter with the error signal supplied by the phase detecting unit and generating the compensated error signal.

12. A radio telephone according to claim 11, wherein the voltage-to-current converter comprises a transistor for connecting the phase detecting unit output to ground, and further comprising means for controlling the size of the current running from the phase detecting unit output to ground by the voltage signal from the integrator to the control electrode of the transistor.

13. A radio telephone according to claim 12, wherein the voltage-to-current converter further comprises an operation amplifier with one input terminal connected to the output of the integrator and to ground via a resistance.

14. A radio telephone according to claim 11, wherein the data-modulated output signal supplied by the voltage controlled oscillator (VCO) has a frequency of about 1900 MHz with a frequency fluctuation of +/−288 kHz, and further comprising a frequency divider in the phase-locked loop (PLL) for returning the output signal to the phase detecting unit.

* * * * *